United States Patent [19]

Palaniappan

[11] Patent Number: 5,150,028
[45] Date of Patent: Sep. 22, 1992

[54] TWO ZENER DIODE ONE POWER SUPPLY FAST TURN OFF

[75] Inventor: Rasappa Palaniappan, Michigan City, Ind.

[73] Assignee: Sundstrand Corporation, Rockford, Ill.

[21] Appl. No.: 606,569

[22] Filed: Oct. 31, 1990

[51] Int. Cl.⁵ .............................................. H02P 5/16
[52] U.S. Cl. .................................. 318/701; 318/138; 318/254; 318/439
[58] Field of Search ........................ 318/701, 778–779, 318/781–797, 476, 138, 254, 439, 138; 388/825; 361/88–91, 30–31

[56] References Cited

U.S. PATENT DOCUMENTS

| 3,638,090 | 1/1972 | Ebbinge. | |
|---|---|---|---|
| 3,697,844 | 10/1972 | Dinger. | |
| 4,143,308 | 3/1979 | Deplante et al. | 318/138 |
| 4,168,455 | 9/1979 | Soeda et al.. | |
| 4,315,202 | 2/1982 | Dawson et al. | 318/718 |
| 4,393,339 | 7/1983 | Kimura | 318/254 |
| 4,535,274 | 8/1985 | Suzuki et al. | 318/254 |
| 4,684,867 | 8/1987 | Miller et al. | 318/701 |
| 4,731,570 | 3/1988 | Lee | 318/696 |
| 4,763,056 | 8/1988 | Byrne et al. | 318/701 |
| 4,896,089 | 1/1990 | Kliman et al. | 318/701 |

Primary Examiner—William M. Shoop, Jr.
Assistant Examiner—David Martin
Attorney, Agent, or Firm—Antonelli, Terry, Stout & Kraus

[57] ABSTRACT

The drive circuit for controlling conductivity of a load switch (12) for controlling current flow through an electrical load (14) in accordance with the invention includes a DC source (20) having a positive terminal and a negative terminal; first and second voltage limiting devices (100) and (102) coupled together at a junction point (108) and an electrode of the first voltage limiting device being coupled to the positive terminal and an electrode of the second voltage limiting device being coupled to the negative terminal and a control circuit (24 and 28) causing current flow through only one of the voltage limiting devices with a reverse current breakdown which reverse biases the control electrode of the load switch causing the load switch to turn off.

25 Claims, 2 Drawing Sheets

TWO ZENER DIODE ONE POWER SUPPLY FAST TURN OFF

TECHNICAL FIELD

The present invention relates to circuits for turning off switches controlling current flow through an electrical load.

BACKGROUND ART

FIG. 1 illustrates a prior art control 10 for controlling the conductivity of a load switch 12 for controlling current flow through an electrical load 14. It should be understood that the control may be used in diverse applications such as driving variable reluctance electric motors. The load switch is a semiconductor switch which may be a bipolar transistor as illustrated. A first switch 16 controls the turning on of the load switch 12 in response to a command from a switch control 18 which turns on the first switch to apply a positive potential from a first DC source 20 to the base of the bipolar transistor 12. Resistor 22 limits the magnitude of the current which flows from the first DC source 20 to the base of the bipolar transistor load switch 12. A second switch 24 controls the turning off of the bipolar transistor load switch 12. The switch control 18 controls the conductivity of the second switch 24 to couple a second DC source 26 which is poled in an opposite direction to the first DC source 20 to reverse bias the base of the bipolar transistor load switch 12. Resistor 28 limits the magnitude of the current flow from the emitter to the base during turning off of the bipolar transistor load switch 12.

The prior art circuit 10 for controlling the conductivity of the load switch 12 has the disadvantage of requiring two DC sources. Two DC sources result in a higher cost and a larger size than the cost and size which would result from a circuit for controlling the conductivity of a load switch with a single DC source.

DISCLOSURE OF THE INVENTION

The present invention is a drive circuit for controlling conductivity of a load switch for controlling current flow through an electrical load which utilizes a single DC source. Utilizing of a single DC source reduces cost and size of a drive circuit when compared to the prior art drive circuit of FIG. 1.

With the invention, first and second voltage limiting devices, which are preferably Zener diodes, are coupled together and to the positive and negative terminals of the DC source. A control circuit causes current flow only through one of the voltage limiting devices during a reverse current breakdown which reverse biases the control electrode of the load switch causing the load switch to turn off. The reverse current breakdown current flow is between the voltage limiting device which is operating in reverse current breakdown and a circuit containing a power electrode of the load switch and an impedance connected in series with the DC source which reverse biases the load switch to turn the load switch off. While the invention preferably controls the conduction of a bipolar transistor for controlling current flow through an electrical load, it should be understood that the invention is not limited thereto with the invention being applicable to diverse types of load switches including semiconductor switches such as three or four layer devices.

A drive circuit for controlling conductivity of a load switch controlling current flow through an electrical load in accordance with the present invention includes a DC source having a positive terminal and a negative terminal; a first switch and a second switch each having a control electrode and first and second power electrodes, the first and second switches having the first power electrodes respectively coupled to the positive and negative terminals and the second power electrodes coupled through an impedance to a junction point coupled to a control electrode of the load switch, conduction of the first switch causing the load switch to turn on by applying a control signal to the control electrode of the load switch and conduction of the second switch causing the load switch to be turned off by applying a control signal to the control electrode of the load switch; first and second voltage limiting devices coupled together at a point coupled to a power electrode of the load switch and an electrode of the first voltage limiting device being coupled to the positive terminal and an electrode of the second voltage limiting device being coupled to the negative terminal; and wherein conduction of the second switch causes current flow through only one of the voltage limiting devices which reverse biases the control electrode of the load switch causing the load switch in response to an electrical potential between the control and the power electrode of the load switch to be turned off. The load switch may be a semiconductor switch such as a transistor and is preferably is a bipolar transistor.

The first and second switches are in a series circuit; and the voltage limiting devices are in a series circuit which is connected in parallel with the series circuit of the first and second switches. Each voltage limiting device has a reverse current breakdown which limits a voltage which is dropped across the voltage limiting device independent of current magnitude and a sum of the voltage limits of the voltage limiting devices is greater than the DC potential so that only one of the voltage limiting devices limits voltage independent of current magnitude when the second switch is conductive. The voltage limiting devices comprise series connected Zener diodes. The current flow through only one of the voltage limiting devices flows between a power electrode of the load switch and a control electrode of the load switch and an impedance.

In a drive circuit for controlling conductivity of a load switch for controlling current flow through an electrical load, an improvement in accordance with the present invention includes a DC source having a positive terminal and a negative terminal; first and second voltage limiting devices coupled together at a coupled to a power electrode of the load switch point and an electrode of the first voltage limiting device being coupled to the positive terminal and an electrode of the second voltage limiting device being coupled to the negative terminal; and a control circuit causing current flow through only one of the voltage limiting devices with a reverse current breakdown which reverse biases the control electrode of the load switch in response to an electrical potential between the control and the power electrode of the load switch causing the load switch to turn off. The control circuit comprises a switch coupled between a power electrode of the load switch and a control electrode of the load switch which when conductive permits current flow between the power electrode, the switch and the control electrode to reverse bias the load switch to turn off the load switch. Each voltage limiting device has a reverse current breakdown which limits a voltage which is dropped across the voltage limiting device independent of current magnitude and a sum of the voltage limits of the voltage limiting devices is greater than the DC potential so that only one of the voltage limiting devices limits voltage independent of current magnitude when the second switch is conductive. The voltage limiting devices comprise series connected Zener diodes which are connected in parallel to a series connection of the first and second switches.

A method of controlling conductivity of a load switch controlling current flow through an electrical load in accordance with the invention includes applying a control signal to a control terminal of the load switch to turn on the load switch; and applying a control signal to the control terminal of the load switch to turn off the load switch by causing current flow through only one of the first and second connected voltage limiting devices which is operating in a reverse current breakdown and between a control electrode of the load switch and each voltage limiting device having a reverse current breakdown which limits a voltage which is dropped across the voltage limiting device independent of current and a sum of the voltage limits of the voltage limiting devices is greater than a DC potential coupled to the voltage limiting devices so that only one of the voltage limiting devices limits voltage independent of current magnitude.

BEST MODE FOR CARRYING OUT THE INVENTION

Figure 1:
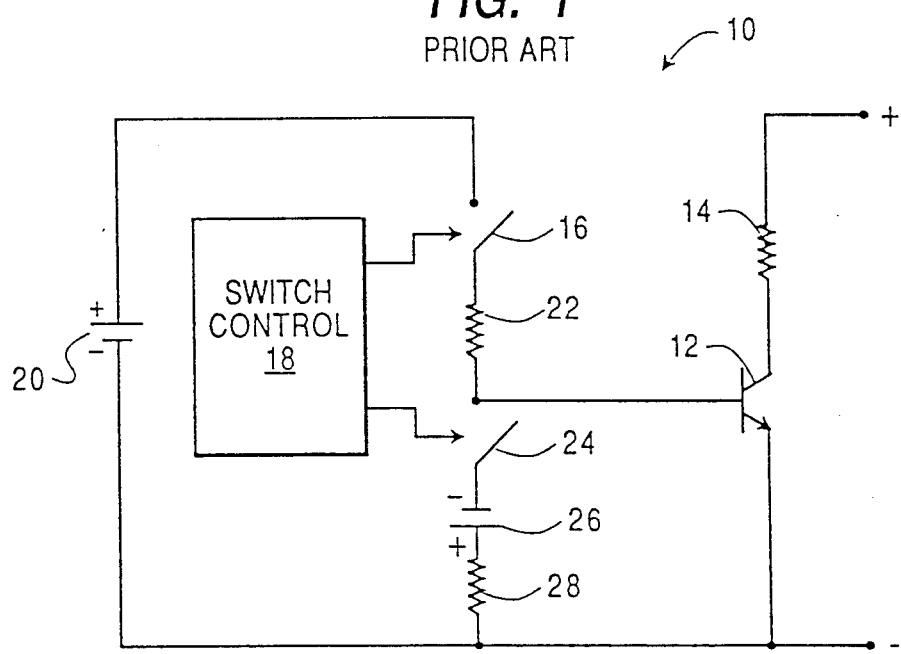
FIG. 1 illustrates a prior art drive circuit for controlling conductivity of a load switch.
Figure 2:
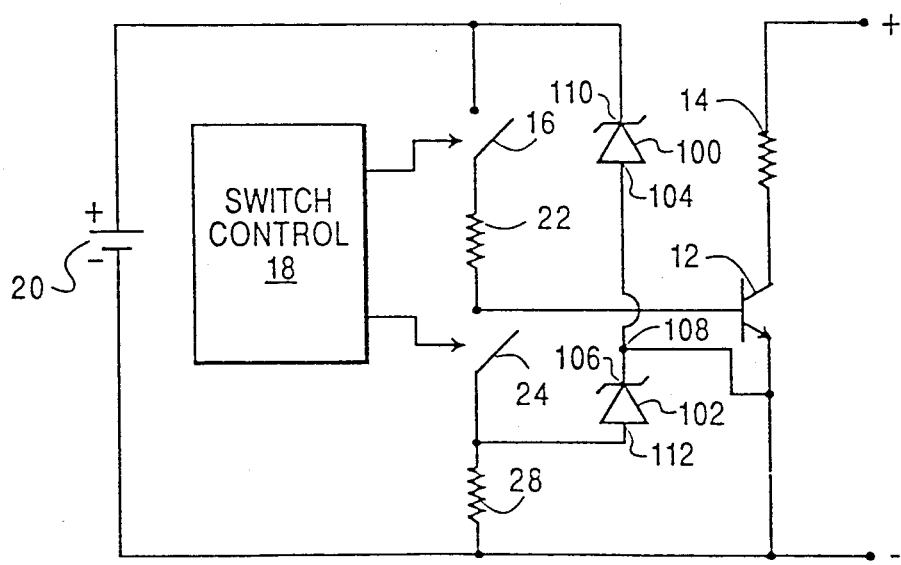
FIG. 2 illustrates a block diagram of the present invention.

FIG. 2 illustrates a block diagram of the present invention. Like reference numerals identify like parts in FIGS. 1 and 2. The drive circuit of FIG. 2 utilizes a single DC source having positive and negative terminals for driving the load switch 12. The first switch 16 controls the turning on of the bipolar load switch 12. The second switch 24 controls the turning off of the bipolar load switch 12. First and second voltage limiting devices 100 and 102 are connected in a series circuit. The voltage limiting devices 100 and 102 are preferably Zener diodes which have a reverse current breakdown which limits a voltage which is dropped across the voltage limiting device independent of current magnitude with a sum of the voltage limits of the voltage limiting devices 100 and 102 being greater than the DC potential 20 so that only one of the voltage limiting devices limits voltage independent of current magnitude when switch 24 is closed as described below. The anode 104 of the Zener diode 100 and the cathode 106 of Zener diode 102 are connected together at a junction point 108 which is connected to the emitter of the bipolar transistor load switch 12. Switch 24 is part of a control circuit causing current flow through only Zener diode 100 with a reverse current breakdown which reverse biases the emitter to base junction of the bipolar transistor load switch 12 causing the load switch to turn off as a consequence of current flow from the positive terminal of the DC potential 20 through the reverse biased Zener diode 100, resistor 28, the base of the bipolar transistor load switch 12 to resistor 28. The resistor 28 limits the current for the aforementioned direction of current flow which causes the bipolar transistor load switch 12 to turn off. The cathode 110 of Zener diode 100 is coupled to the positive terminal of the DC power source 20 and to a power terminal of the first switch 16. The anode of the Zener diode 102 is coupled to the negative terminal of the DC potential 20 through resistor 28 and to a power terminal of the second switch 24. It should be understood that the switch control 18 may be programmed to cause current flow through the load 14 for diverse applications with the switch control forming no part of the present invention. The conduction of the first switch 16 functions to apply a control signal to the base of the bipolar transistor load switch 12 causing turning on of the transistor. Conduction of the second transistor 24 causes application of a control signal of the base of the bipolar transistor load switch 12 in the manner described above to turn off the transistor. The turning on and off of the bipolar transistor load switch 12 is achieved by switching the potential of only a single power source 20 unlike the prior art of FIG. 1 which required two power sources with the attendant disadvantages described above.

The sum of the reverse current breakdown voltage limits of the voltage limiting Zener diodes 100 and 102 is chosen greater than the magnitude of the DC potential 20 so that the dropping of the DC potential 20 across the Zener diode 100 upon conduction 24 of switch 24 causes reverse current breakdown in only the Zener diode 100 completing the coupling of current flow to the emitter to base junction to reverse bias the bipolar transistor load switch 12 as described above. Zener diode 102 does not break down. As a consequence of the sum of the voltage limits being greater than the DC potential 20, the circuit comprised of the series connected Zener diodes 100 and 102 blocks current flow between a power electrode of the first switch 16 and a power electrode of the second switch 24 regardless of the state of conduction of the first and second switches 16 and 24, but upon the closing of the second switch 24, provides for a current flow from the positive terminal 20 through the reverse biased Zener diode 100 to junction point 108 through the emitter to the base of the bipolar transistor load switch 12 through the conductive switch 24 and resistor 28 to cause turn off.

Figure 3:
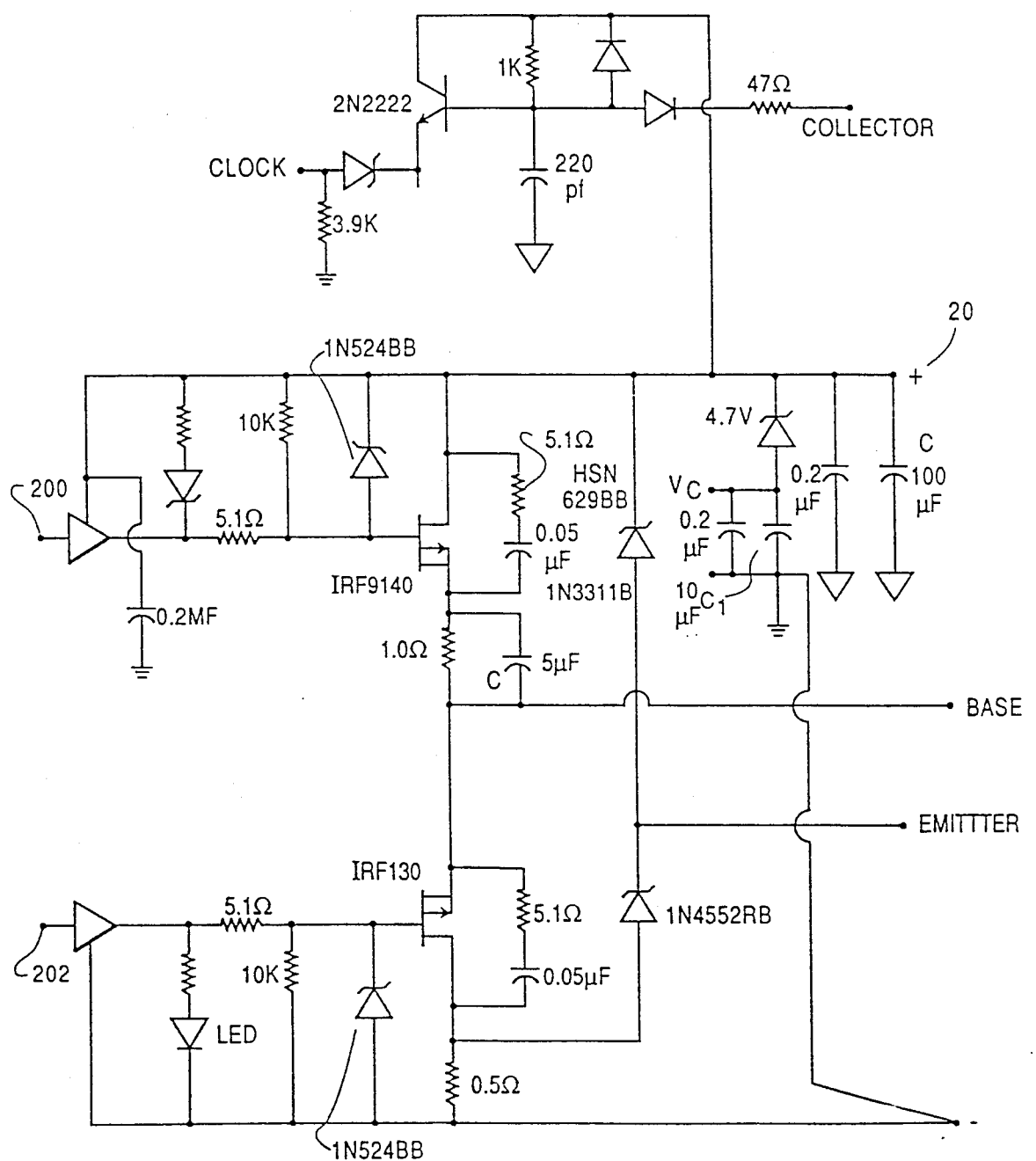
FIG. 3 illustrates an embodiment of the present invention.

FIG. 3 illustrates a circuit implementation of the invention illustrated in FIG. 2. Components are identified by their component values and/or manufacturer's designation. The "CLOCK" input is from a clock controlling the switching rate of the drive signals applied to inputs 200 and 202. The polarities indicated correspond to the polarities of the DC potential 20. The labelled outputs, COLLECTOR, BASE and EMITTER, correspond to the points of connection to the bipolar transistor load switch 12. It should be understood that FIG. 3 is only an example of possible circuit implementations of the invention as illustrated in the block diagram of FIG. 2.

While the invention has been described in terms of its preferred embodiments, it should be understood that numerous modifications may be made thereto without departing from the spirit and scope of the invention as defined in the appended claims. It is intended that all such modifications fall within the scope of the appended claims.

I claim:

1. A drive circuit for controlling conductivity of a load switch for controlling current flow through an electrical load comprising:

a DC source having a positive terminal and a negative terminal;

a first switch and a second switch each having a control electrode and first and second power electrodes, the first and second switches having the first power electrodes respectively coupled to the positive and negative terminals and the second power electrodes coupled to a junction point coupled to a control electrode of the load switch, conduction of the first switch causing the load switch to turn on by applying a control signal to the control electrode of the load switch and conduction of the second switch causing the load switch to be turned off by applying a control signal to the control electrode of the load switch;

first and second voltage limiting devices coupled together at a point coupled to a power electrode of the load switch and an electrode of the first voltage limiting device being coupled to the positive terminal and an electrode of the second voltage limiting device being coupled to the negative terminal; and wherein conduction of the second switch causes current flow through only one of the voltage limiting devices which reverse biases the control electrode of the load switch in response to an electrical potential between the control and the power electrode of the load switch causing the load switch to be turned off.

2. A drive circuit in accordance with claim 1 wherein:

the load switch is a semiconductor switch.

3. A drive circuit in accordance with claim 2 wherein:

the load switch is a transistor.

4. A drive circuit in accordance with claim 3 wherein:

the load switch is a bipolar transistor.

5. A drive circuit in accordance with claim 1 wherein:

the first and second switches are in a series circuit; and the voltage limiting devices are in a series circuit which is connected in parallel to a series connection of the first and second switches.

6. A drive circuit in accordance with claim 5 wherein:

each voltage limiting device has a reverse current breakdown which limits a voltage which is dropped across the voltage limiting device independent of current magnitude and a sum of the voltage limits of the voltage limiting devices is greater than the DC potential so that only one of the voltage limiting devices limits voltage independent of current magnitude when the second switch is conductive.

7. A drive circuit in accordance with claim 6 wherein:

the voltage limiting devices comprise series connected Zener diodes.

8. A drive circuit in accordance with claim 7 wherein:

a current flow through only one of the voltage limiting devices flows between the power electrode of the load switch, the control electrode of the load switch and an impedance coupled to the second switch and to the one voltage limiting device.

9. A drive circuit in accordance with claim 2 wherein:

the first and second switches are in a series circuit; and the voltage limiting devices are in a series circuit which is connected in parallel to a series connection of the first and second switches.

10. A drive circuit in accordance with claim 9 wherein:

each voltage limiting device has a reverse current breakdown which limits a voltage which is dropped across the voltage limiting device independent of current magnitude and a sum of the voltage limits of the voltage limiting devices is greater than the DC potential so that only one of the voltage limiting devices limits voltage independent of current magnitude when the second switch is conductive.

11. A drive circuit in accordance with claim 10 wherein:

the voltage limiting devices comprise series connected Zener diodes.

12. A drive circuit in accordance with claim 11 wherein:

current flow through only one of the voltage limiting devices flows between the power electrode of the load switch, the control electrode of the load switch and an impedance coupled to the second switch and to the one voltage limiting device.

13. A drive circuit in accordance with claim 3 wherein:

the first and second switches are in a series circuit; and the voltage limiting devices are in a series circuit which is connected in parallel to a series circuit of the first and second switches.

14. A drive circuit in accordance with claim 13 wherein:

each voltage limiting device has a reverse current breakdown which limits a voltage which is dropped across the voltage limiting device independent of current magnitude and a sum of the voltage limits of the voltage limiting devices is greater than the DC potential so that only one of the voltage limiting devices limits voltage independent of current magnitude when the second switch is conductive.

15. A drive circuit in accordance with claim 14 wherein:

the voltage limiting devices comprise series connected Zener diodes.

16. A drive circuit in accordance with claim 15 wherein:

a current flow through only one of the voltage limiting devices flows between the power electrode of the load switch, the control electrode of the load switch and an impedance coupled to the second switch and to the one voltage limiting device.

17. A drive circuit in accordance with claim 4 wherein:

the first and second switches are in a series circuit; and the voltage limiting devices are in a series circuit which is connected in parallel to a series circuit of the first and second switches.

18. A drive circuit in accordance with claim 17 wherein:
  each voltage limiting device has a reverse current breakdown which limits a voltage which is dropped across the voltage limiting device independent of current magnitude and a sum of the voltage limits of the voltage limiting devices is greater than the DC potential so that only one of the voltage limiting devices limits voltage independent of current magnitude when the second switch is conductive.

19. A drive circuit in accordance with claim 18 wherein:
  the voltage limiting devices comprise series connected Zener diodes.

20. A drive circuit in accordance with claim 19 wherein:
  a current flow through only one of the voltage limiting devices flows between the power electrode of the load switch, the control electrode of the load switch and an impedance coupled to the second switch and to the one voltage limiting device.

21. In a drive circuit for controlling conductivity of a load switch for controlling current flow through an electrical load, and improvement comprising:
  a DC source having a positive terminal and a negative terminal;
  first and second voltage limiting devices coupled together at a point coupled to a power electrode of the load switch and an electrode of the first voltage limiting device being coupled to the positive terminal and an electrode of the second voltage limiting device being coupled to the negative terminal; and
  a control circuit causing current flow through only one of the voltage limiting devices with a reverse current breakdown which reverse biases the control electrode of the load switch in response to an electrical potential between the control and the power electrode of the load switch causing the load switch to turn off.

22. A drive circuit in accordance with claim 21 wherein the control circuit comprises:
  a switch coupled between the power electrode of the load switch and the DC source which when conductive permits current flow between the DC source, the switch and the power electrode to reverse bias the load switch to turn off the load switch.

23. In a drive circuit for controlling conductivity of a load switch for controlling current flow through an electrical load, an improvement comprising:
  a DC source having a positive terminal and a negative terminal;
  first and second voltage limiting devices coupled together at a junction point coupled to a power electrode of the load switch and an electrode of the first voltage limiting device being coupled to the positive terminal and an electrode of the second voltage limiting device being coupled to the negative terminal; and
  a control circuit causing current flow through only one of the voltage limiting devices with a reverse current breakdown which reverse biases the control electrode of the load switch in response to an electrical potential between the control and the power electrode of the load switch causing the load switch to turn off; and
  each voltage limiting device has a reverse current breakdown which limits a voltage which is dropped across the voltage limiting device independent of current magnitude and a sum of the voltage limits of the voltage limiting devices is greater than the DC potential so that only one of the voltage limiting devices limits voltage independent of current magnitude when the second switch is conductive.

24. A drive circuit in accordance with claim 23 wherein:
  the voltage limiting devices comprise series connected Zener diodes which are connected in parallel to a series connection of the first and second switches.

25. A method of controlling conductivity of a load switch controlling current flow through an electrical load comprising:
  applying a control signal to a control terminal of the load switch to turn on the load switch; and
  applying a control signal to the control terminal of the load switch to turn off the load switch by causing current flow through only one of first and second connected voltage limiting devices which is operating in a reverse current breakdown and between a control electrode of the load switch and each voltage limiting device having a reverse current breakdown which limits a voltage which is dropped across the voltage limiting device independent of current and a sum of the voltage limits of the voltage limiting devices is greater than a DC potential coupled to the voltage limiting devices so that only one of the voltage limiting devices limits voltage independent of current magnitude.

* * * * *

UNITED STATES PATENT AND TRADEMARK OFFICE
CERTIFICATE OF CORRECTION

PATENT NO. : 5,150,028
DATED : September 22, 1992
INVENTOR(S) : Rasappa Palaniappan It is certified that error appears in the above-indentified patent and that said Letters Patent is hereby corrected as shown below:

On the title page, Item [73]: Assignee; delete "Sundstrand Corporation" and insert --Sullair Corporation--.

Signed and Sealed this

Eighth Day of March, 1994

Attest:

BRUCE LEHMAN

*Attesting Officer*   *Commissioner of Patents and Trademarks*